United States Patent
Li (10) Patent No.: US 9,634,131 B2
(45) Date of Patent: Apr. 25, 2017

(54) INSULATED GATE BIPOLAR DEVICE (71) Applicant: Changzhou ZhongMin Semi-Tech Co. Ltd., Changzhou (CN)

(72) Inventor: Yuzhu Li, Jintan (CN)

(73) Assignee: CHANGZHOU ZHONGMIN SEMI-TECH CO. LTD., Changzhou (CN)

( * ) Notice: Subject to any disclaimer, the term of this patent is extended or adjusted under 35 U.S.C. 154(b) by 0 days.

(21) Appl. No.: 15/016,254

(22) Filed: Feb. 4, 2016

(65) Prior Publication Data

US 2016/0233324 A1 Aug. 11, 2016

Related U.S. Application Data (60) Provisional application No. 62/112,265, filed on Feb. 5, 2015, provisional application No. 62/126,937, filed (Continued)

(51) Int. Cl.
*H01L 29/73* (2006.01)
*H01L 29/739* (2006.01)
*H01L 21/306* (2006.01)
*H01L 21/04* (2006.01)
*H01L 21/02* (2006.01)
*H01L 21/311* (2006.01)

(Continued)

(52) U.S. Cl.
CPC ...... *H01L 29/7397* (2013.01); *H01L 21/0217* (2013.01); *H01L 21/02164* (2013.01); *H01L 21/02236* (2013.01); *H01L 21/0475* (2013.01); *H01L 21/3081* (2013.01); *H01L 21/3086* (2013.01); *H01L 21/30604* (2013.01); *H01L 21/31111* (2013.01); *H01L 23/53271* (2013.01); *H01L 29/0696* (2013.01); *H01L 29/0804* (2013.01); *H01L 29/0821* (2013.01); *H01L 29/1095* (2013.01); *H01L 29/16* (2013.01); *H01L 29/1608* (2013.01); *H01L 29/2003* (2013.01); *H01L 29/4236* (2013.01); *H01L 29/4916* (2013.01); *H01L 21/02238* (2013.01); *H01L 21/02255* (2013.01)

(58) Field of Classification Search
CPC ................. H01L 29/0696; H01L 29/1095
See application file for complete search history.

(56) References Cited

U.S. PATENT DOCUMENTS

2005/0156231 A1* 7/2005 Okuno ............... H01L 29/0696
                                                                    257/328
2010/0039844 A1* 2/2010 Arai .................... H01L 29/0839
                                                                    363/131

(Continued)

*Primary Examiner* — Benjamin Sandvik
(74) *Attorney, Agent, or Firm* — Edward S. Sherman (57) ABSTRACT

A semiconductor device includes: metal collector layer on backside, P-type collector layer, N-type field stop layer and N− drift layer. There are active cells and dummy cells on top of the device. The active cell and dummy cell are separated by gate trench. The gate trench is formed by polysilicon and gate oxide layer. There are N+ region and P+ region in active cells, and they are connected to metal emitter layer through the window in the insulation layer. There are P-well regions in both active cells and dummy cells. The P-well regions in active cells are continuous and connected to emitter electrode through P+ region. The P-well regions in dummy cells are discontinuous and electrically floating.

11 Claims, 6 Drawing Sheets

Related U.S. Application Data on Mar. 2, 2015, provisional application No. 62/126,961, filed on Mar. 2, 2015, provisional application No. 62/148,921, filed on Apr. 17, 2015.

(51) Int. Cl.
*H01L 21/308* (2006.01)
*H01L 29/06* (2006.01)
*H01L 23/532* (2006.01)
*H01L 29/16* (2006.01)
*H01L 29/20* (2006.01)
*H01L 29/423* (2006.01)
*H01L 29/49* (2006.01)
*H01L 29/08* (2006.01)
*H01L 29/10* (2006.01)

(56) References Cited

U.S. PATENT DOCUMENTS

| | | | |
|---|---|---|---|
| 2011/0193132 A1* | 8/2011 | Kouno | H01L 29/0619 257/139 |
| 2012/0012860 A1* | 1/2012 | Miyahara | H01L 29/0696 257/77 |
| 2012/0181575 A1* | 7/2012 | Pfirsch | H01L 29/0834 257/139 |
| 2012/0292662 A1* | 11/2012 | Matsuura | H01L 29/66348 257/139 |

\* cited by examiner

PRIOR ART

INSULATED GATE BIPOLAR DEVICE

CROSS REFERENCE TO RELATED APPLICATIONS

The present application claims the benefit of priority to the US Provisional patent application of the same title that was filed on Feb. 5, 2015, having application Ser. No. 62/112,256, and is incorporated herein by reference.

The present application also claims the benefit of priority to the US Provisional patent application of the same title that was filed on Mar. 2, 2015, having application Ser. No. 62/126,937, and is incorporated herein by reference.

The present application also claims the benefit of priority to the US Provisional patent application of the same title that was filed on Mar. 2, 2015, having application Ser. No. 62/126,961, and is incorporated herein by reference.

The present application also claims the benefit of priority to the US Provisional patent application of the same title that was filed on Apr. 17, 2015, having application Ser. No. 62/148,921, and is incorporated herein by reference.

BACKGROUND OF INVENTION

1. Field of the Invention

The present invention relates to power semiconductor devices, especially to Insulated Gate Bipolar Transistor (IGBT).

2. Related Background Art

Insulated Gate Bipolar Transistor (IGBT) is the preferred semiconductor device for high power applications, capable of providing high blocking voltage and high conducting current and can be controlled conveniently. There are many different IGBT structure designs. A dummy cell structure is often used in those IGBT design, as disclosed in U.S. Pat. No. 8,633,510 (which issued to Matsura et al. on Jan. 21, 2014) which is incorporated herein by reference and is hereinafter referred to as the '510 patent.

Figure 1:
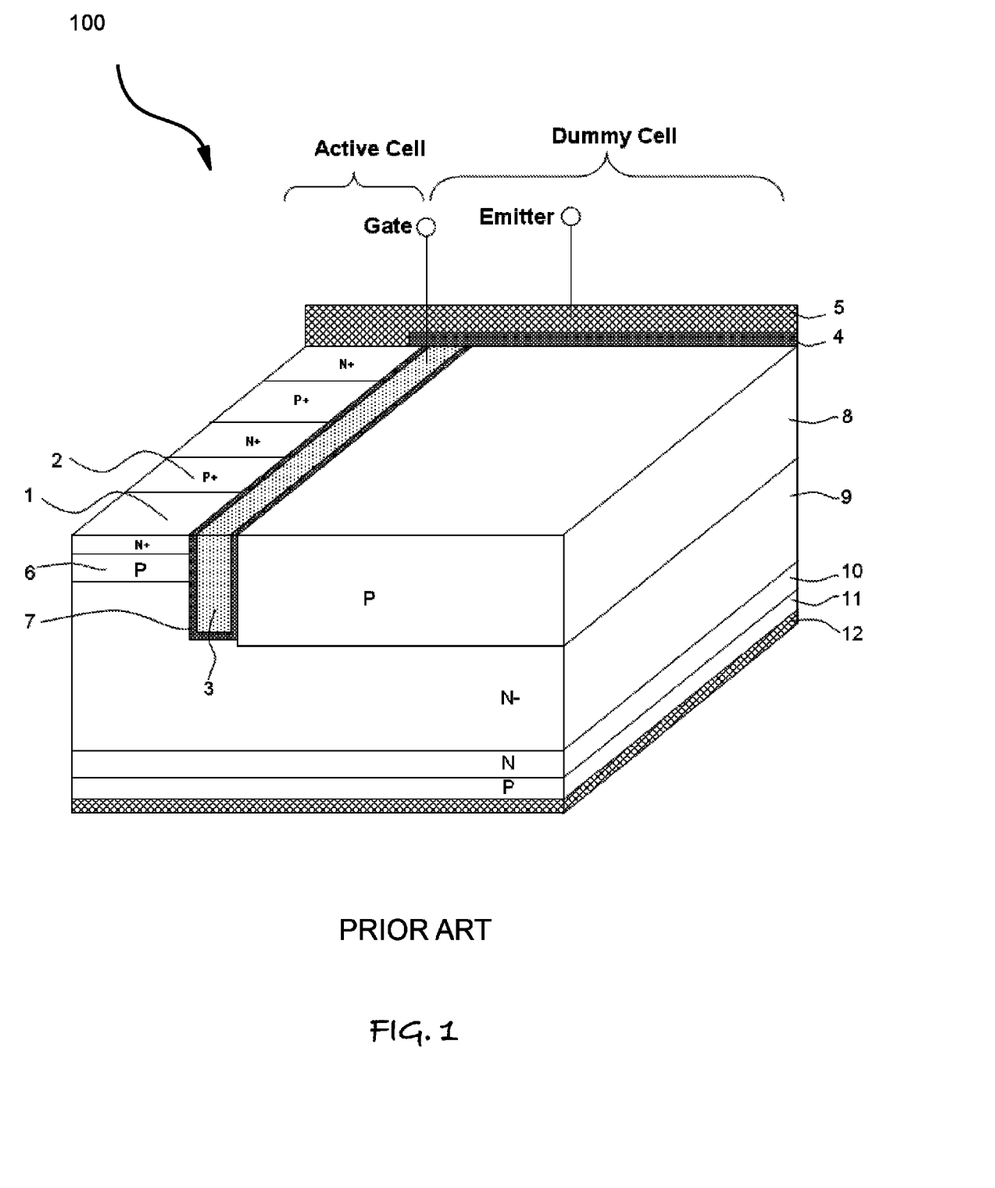
FIG. 1 is a schematic view of a prior art IGBT structure.

A typical IGBT structure described in the '510 patent is shown in FIG. 1. This structure includes: a metal collector layer 12 on backside, P-type collector layer 11, N-type field stop layer 10 and N− drift layer 9. On top of the device, there are active cells and dummy cells. The active cell and dummy cell are separated by a gate trench. The trench structures are formed by polysilicon 3 and gate oxide layer 7. Polysilicon 3 is connected to gate electrode. There are N+ region 1 and P+ region 2 in active cells, and they are connected to metal emitter layer 5 through the window in the insulation layer 4. The P-well region 6 in active cells is connected to emitter electrode through P+ region 2. In the dummy cells, there are deep P-wells 8. P-well 8 is not connected to any electrode, and therefore is electrically floating.

The characteristics of FIG. 1 structure is the deep P-well 8 used in the dummy cells and has the advantage of reduced gate capacitance. However, this deep P-well design requires additional diffusion process and thus higher process cost. This deep P-well 8 also forms a large area PN junction with N− drift layer 9, reducing stored carrier density in forward conduction mode and thus the forward saturation voltage (Vcesat) is relatively high.

Accordingly, what is needed is a new design of IGBT structure with reduced process cost and lower Vcesat.

The above and other objects, effects, features, and advantages of the present invention will become more apparent from the following description of the embodiments thereof taken in conjunction with the accompanying drawings

SUMMARY OF INVENTION

According to first aspect of the present invention there is provided a semiconductor device having a front side and a back side opposing the front side, which comprises a metal collector layer on the backside, a layered semiconductor material disposed on the metal collector layer being selectively doped to provide; a first P-type collector layer disposed on the metal collector layer, an N-type field stop layer disposed on the P-type collector layer; and an N− drift layer disposed on the N-type stop layer, a gate trench having a conductive core that is surrounded by a gate oxide layer, that extends at least partially within the N-drift layer to subdivide the N-drift layer into an active cell region and a dummy cell region, which are disposed proximal to the front side of the device, an insulation layer at least partially covering the N-drift layer and the gate trench formed therein, a metal emitter layer disposed on the insulation layer and connected through a window in the insulation layer to the active cells region, which comprise: one or more N+ region alternating with a plurality of P+ regions, a first P-well region disposed between the alternating N+ and P+ regions and the N− drift layer, the first P-well regions in active cells being continuous and connected to the metal emitter electrode through the P+ regions, wherein the dummy cell region comprises one or more second P-well regions that are discontinuous and electrically floating.

According to the second aspect of the present invention, the semiconductor device described above further comprises polysilicon-bridge over the dummy cell.

In another aspect of the invention, there are holes in the polysilicon-bridge above the floating P-well region.

The above and other objects, effects, features, and advantages of the present invention will become more apparent from the following description of the embodiments thereof taken in conjunction with the accompanying drawings.

DETAILED DESCRIPTION

Referring to FIGS. 1 through 6, wherein like reference numerals refer to like components in the various views, there is illustrated therein a new and improved insulated gate bipolar device, generally denominated 100 herein.

Figure 2:
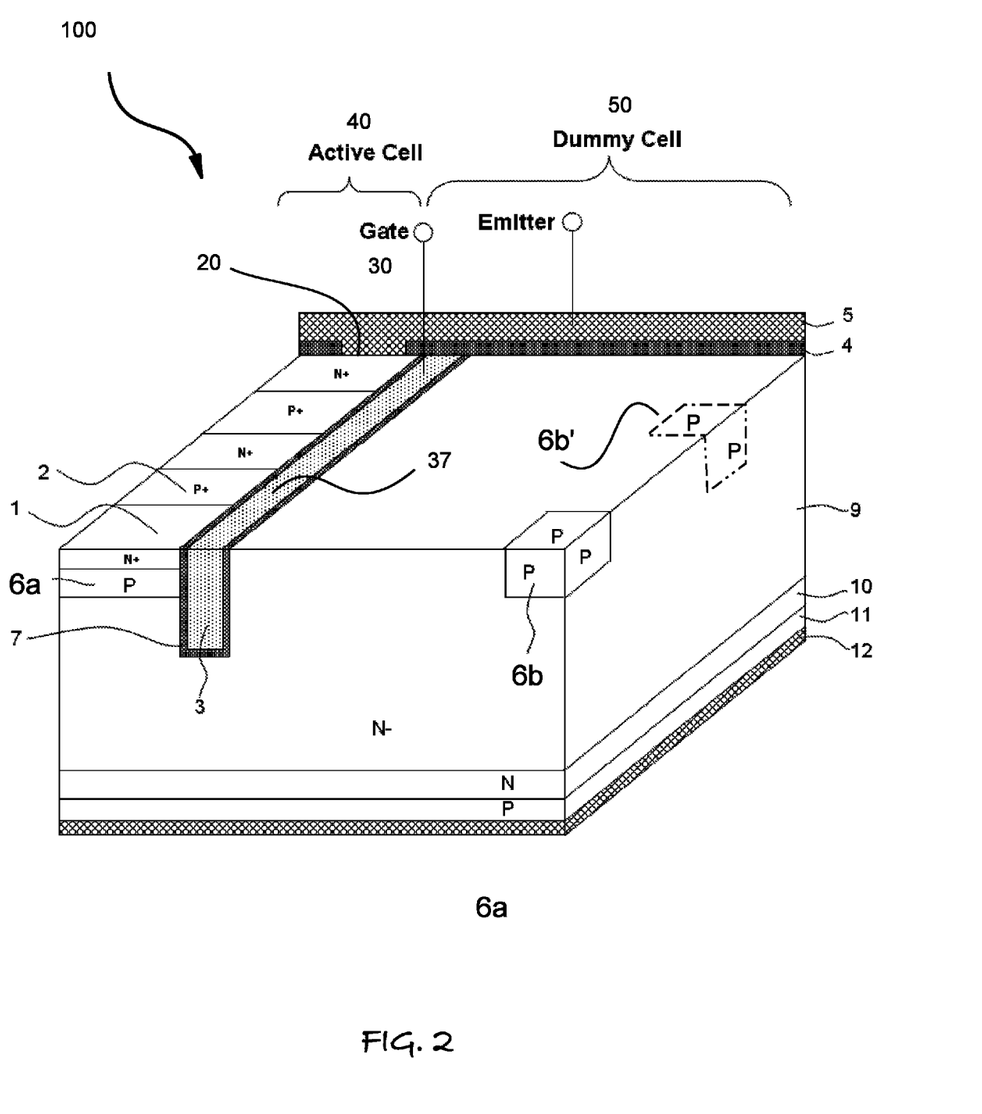
FIG. 2 is a schematic view of first embodiment of the present invention.
Figure 3:
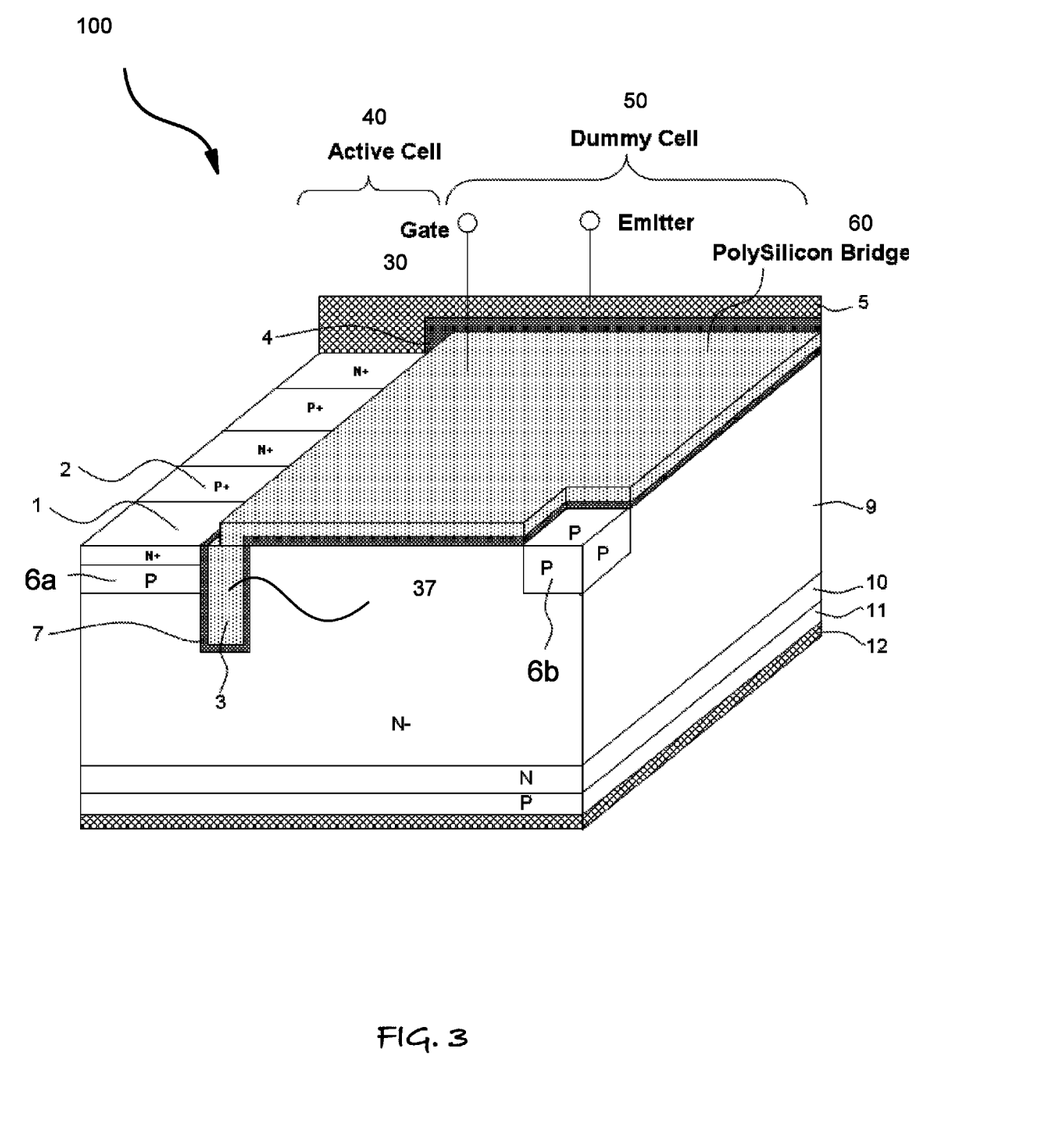
FIG. 3 is a schematic view of second embodiment of the present invention.

Some embodiments of the present invention will be described hereafter with reference to the drawings. Drawing FIG. 1-3 are partial cut-away perspective view of semiconductor device in which the upper layers of the emitter and/or gate and planar insulating layer are shown schematically in section only to better reveal the underlying structure. No intent is made to illustrate specific size or proportions, as these will be well understood by those skilled in the art of such semi-conductor devices with the aid of the following descriptions.

FIG. 2 is the schematic view of first embodiment of a semiconductor device 100 according to the present invention. This device 100 comprises: a metal collector layer on backside 12, P-type collector layer 11, N-type field stop layer 10 and N− drift layer 9, which is a lightly doped N-type layer. There are active cells 40 and dummy cells 50 on top of the device. The active cell 40 and dummy cell 50 are separated by a gate trench 37. The gate trench structure 37 is preferably formed of a polysilicon core 3 which is surrounded by a gate oxide layer 7. Polysilicon core 3 is connected to the gate electrode 30. There are N+ region 1, which is a heavily doped N-type layer, and P+ region 2, which is a heavily doped P-type layer in active cells 40, and they are connected to metal emitter layer 5 through the window or opening 20 in the insulation layer 4. The P-well regions 6a and 6b are formed simultaneously both in the active cells and dummy cells. The P-well region 6a in active cells is continuous and is connected to emitter electrode (metal emitter layer 5) through the P+ region 2. The P-well region 6b in dummy cells forms discontinuous, isolated region and is electrically floating. The dummy cells may contain multiple P-wells regions 6b, in which an optional additional cell 6b' is shown in broken lines, which can be repeated in the direction of the gate trench 37.

The characteristics of above mentioned device lie in that the one or more floating P-well 6b in dummy cells forms discontinuous, isolated region and is electrically floating.

FIG. 3 is the schematic view of second embodiment of a semiconductor device according to the present invention. A polysilicon-bridge 60 is placed over the dummy cell 50. There are holes in the polysilicon-bridge 60 above the floating P-well region 6. The advantage of using this polysilicon-bridge 60 is that the polysilicon-bridge 60 can be used as a self-aligned mask for implant process to fabricate P-well 6, thus saving an additional mask for fabricating P-well 6.

The qualitative analysis of the structure of the present invention is the following.

In the structure shown in FIG. 1, P-well 8 used in dummy cells and P-well 6 in active cells are of different depth and thus can't be fabricated simultaneously. Further, the construction results in a large area PN junction between deep P-well 8 and N− drift layer 9. Although P-well 8 is electrically floating, the PN junction between P-well 8 and N− drift layer 9 still has a built-in depletion region, and would reduce stored carrier density in forward conduction mode resulting in a forward saturation voltage ($V_{cesat}$) that is relatively high.

In the structure shown in FIG. 2, P-well 6b used in the dummy cells and P-well 6a in active cells are of the same depth and thus can be fabricated simultaneously. A further advantageous results accrues because the P-well 6b in dummy cells form discontinuous, isolated regions with the area of the P-N junction between P-well 6b and N− drift layer 9 being reduced compared with FIG. 1 structure. Thus, the stored carrier density in forward conduction mode is higher than FIG. 1 structure. Hence, the forward saturation voltage ($V_{cesat}$) in the inventive structure of FIG. 2 is lower than in the FIG. 1 structure.

To compare the performance of the two different structures quantitatively, three-dimensional numeric simulations on forward conduction mode were carried out. Although all IGBT structures can be used for all voltage ratings, only IGBT structures rated at 1200V were used in the simulations as an example. All structures in the simulations had the same topologies and adopted same parameters for all corresponding layers.

Figure 4:
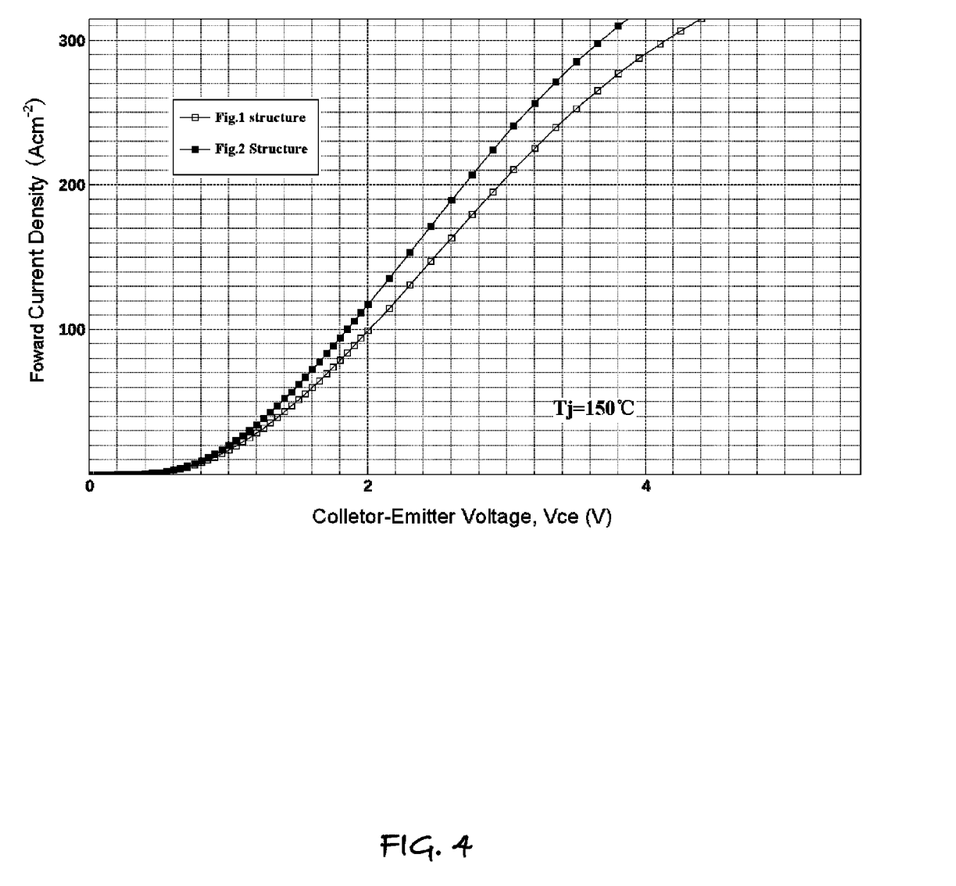
FIG. 4 is the comparison of forward I-V curves of FIG. 1—structure and FIG. 2—structure.

FIG. 4 is the comparison of forward I-V curves of the two IGBT structures (structure shown in FIG. 1 and FIG. 2). The junction temperature (Tj) of all three structures was set at 150° C., and Vcesat was measured at forward current density of 150 Acm-2.

Vcesat values are listed in the following table.

|  | FIG. 1 structure (Prior art) | FIG. 2 structure |
|---|---|---|
| Vcesat | 2.47 V | 2.27 V |

It can be seen that the Vcesat of this invention is significantly lower than the Prior art FIG. 1 structure.

Figure 5:
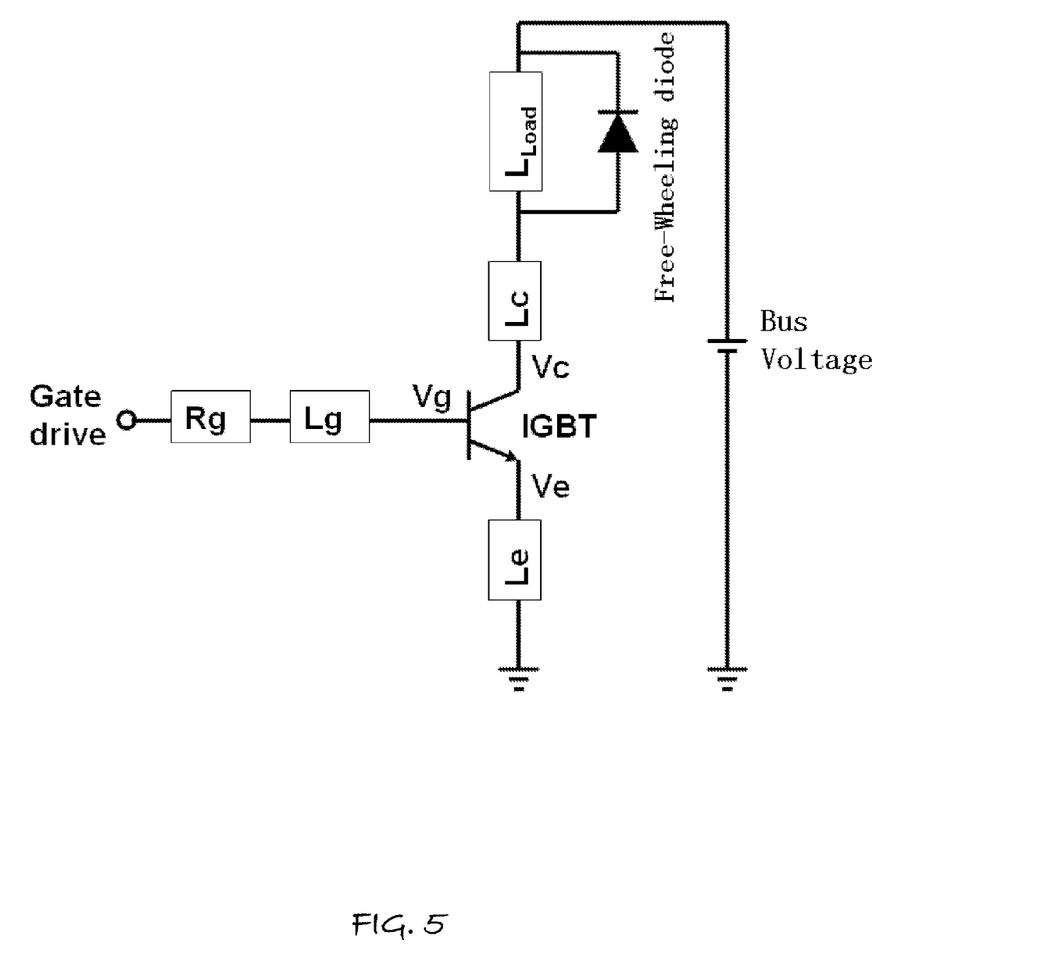
FIG. 5 is the hard switching circuit used in the simulation.

Three-dimensional numeric simulations on turnoff process were also carried out for the two structures. FIG. 5 shows the hard switching circuit used in the simulation. This circuit comprises IGBT and free-wheeling diode, load inductor ($L_{Load}$) and high voltage bus. The gate of the IGBT is controlled by gate driver through gate resistor (Rg). The circuit also comprises parasitic inductors (Lg, Lc and Le).

Figure 6:
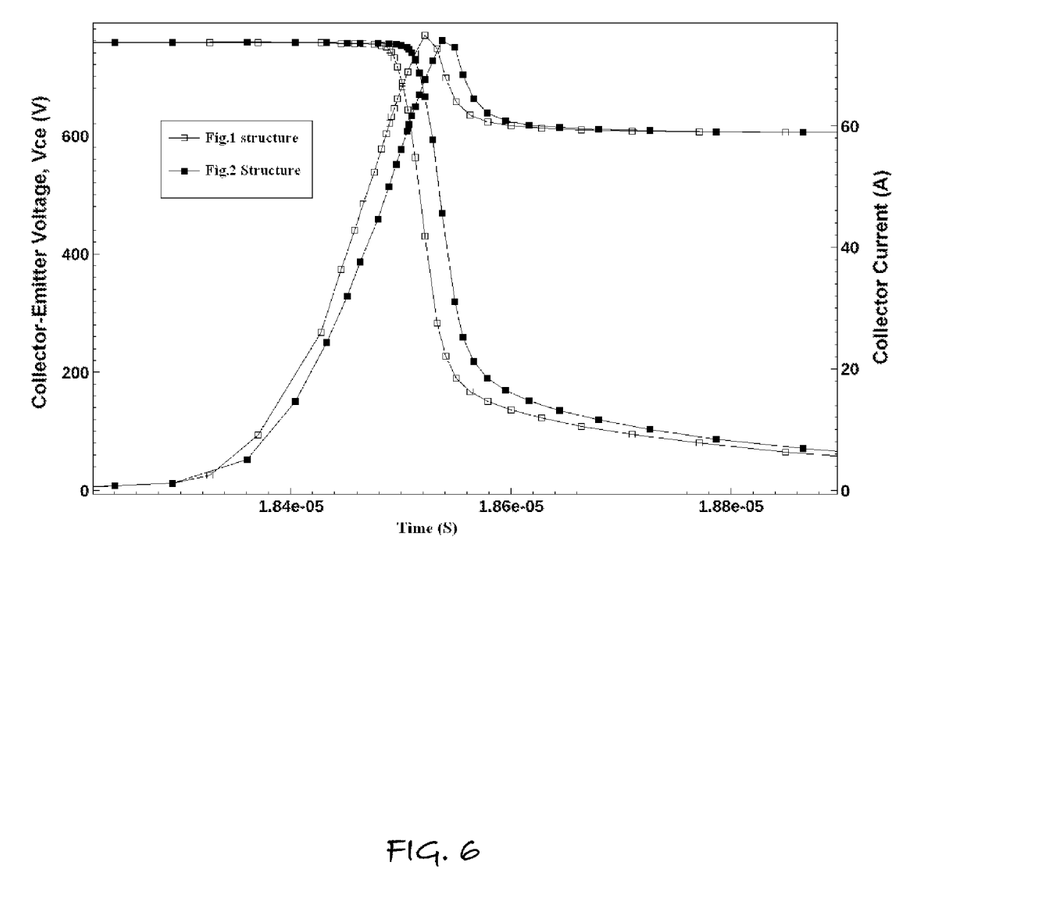
FIG. 6 is the comparison of turnoff waveforms of FIG. 1—structure and FIG. 2—structure.

FIG. 6 is the comparison of the turnoff waveforms of two IGBT structures (the Prior art structure shown in FIG. 1 and the inventive structure of FIG. 2). All structures simulated have same chip active area of 0.5 cm². Bus voltage is set at 600V and load current is set at 75 A. The free-wheeling diode structure used in the simulations is the same. Gate resistor is kept at 15 ohms. The junction temperature of all semiconductor devices used in the simulation was set at 150° C.

Turnoff process performance, including turnoff energy (Eoff) and Vce peak voltage are listed in the following table.

| Parameter | FIG. 1 structure Prior art | FIG. 2 structure |
|---|---|---|
| Eoff | 8.218 mJ | 8.756 mJ |
| Vce peak | 771 V | 761 V |

It can be seen that turnoff energy of this invention is only 6.5% higher than that of FIG. 1 structure. Besides, the Vce peak voltage of this invention is the lower, resulting in an improved robustness.

Although the present invention has been described in relation to particular embodiments thereof, many other variations and modifications and other uses will become apparent to those skilled in the art. For example, any of the P and N type semiconductor material in the inventive device can be selected from the group of materials that consist of silicon, silicon carbide and gallium nitride. While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

I claim:

1. A semiconductor device having a front side and a back side opposing the front side, which comprises:
   a) a metal collector layer on the backside,
   b) a layered semiconductor material disposed on the metal collector layer being selectively doped to provide;

i) a first P-type collector layer disposed on the metal collector layer,
ii) an N-type field stop layer disposed on the P-type collector layer; and
iii) a lightly doped N-type drift layer disposed on the N-type stop layer,
c) a gate trench having a conductive core that is surrounded by a gate oxide layer, that extends at least partially within the N-drift layer to subdivide the N-drift layer into an active cell region and a dummy cell region, which are disposed proximal to the front side of the device,
d) an insulation layer at least partially covering the N-drift layer and the gate trench formed therein,
e) a metal emitter layer disposed on the insulation layer and connected through a window in the insulation layer to the active cells region, which comprise:
i) one or more N+ region alternating with a plurality of P+ regions,
ii) a first P-well region disposed between the alternating N+ and P+ regions and the N− drift layer, the first P-well regions in active cells being continuous in a first direction along the gate trench and connected to the metal emitter electrode through the P+ regions,
f) wherein the dummy cell region comprises one or more second P-well regions that are surrounded by the N− drift layer and isolated from the metal emitter layer by the insulation layer.

2. The semiconductor device according to claim 1 wherein the one or more second P-well regions are discontinuous and extend in the direction of the gate trench a shorter distance than the first P-well regions.

3. The semiconductor device according to claim 2, which further comprises a polysilicon-bridge disposed between the dummy cell region and a portion of the insulating layer to overlay the second P-well regions.

4. The semiconductor device according to claim 3 further comprising holes in the polysilicon-bridge.

5. The semiconductor device according to claim 1, wherein the semiconductor device has P and N material selected from the group consisting of silicon, silicon carbide and gallium nitride.

6. The semiconductor device according to claim 4, wherein the semiconductor device has P and N material selected from the group consisting of silicon, silicon carbide and gallium nitride.

7. The semiconductor device according to claim 1, wherein the semiconductor device has P and N material selected from the group consisting of silicon, silicon carbide and gallium nitride.

8. The semiconductor device according to claim 1 wherein the conductive core of the gate trench is polysilicon.

9. The semiconductor device according to claim 2 wherein the conductive core of the gate trench is polysilicon.

10. The semiconductor device according to claim 3 wherein the conductive core of the gate trench is polysilicon.

11. The semiconductor device according to claim 1, which further comprises a polysilicon-bridge disposed between the dummy cell region and a portion of the insulating layer to overlay the second P-well regions.

* * * * *